(12) United States Patent
Vallinan et al.

(10) Patent No.: US 6,271,658 B1
(45) Date of Patent: Aug. 7, 2001

(54) UNIVERSAL DOCKING SYSTEM

(75) Inventors: John Zenon G. Vallinan; Chee-Keong Tan, both of Singapore (SG)

(73) Assignee: ST Assembly Test Services Pte, Ltd., Singapore (SG)

(*) Notice: Subject to any disclaimer, the term of this patent is extended or adjusted under 35 U.S.C. 154(b) by 0 days.

(21) Appl. No.: 09/174,620

(22) Filed: Oct. 19, 1998

(51) Int. Cl.[7] .................................................. G01R 1/04
(52) U.S. Cl. ............................................................ 324/158.1
(58) Field of Search ................................ 324/158.1, 754, 324/755, 758, 765; 414/220, 216, 222; 73/866.5, 865.8

(56) References Cited

U.S. PATENT DOCUMENTS

| | | | |
|---|---|---|---|
| 4,527,942 | 7/1985 | Smith | 414/590 |
| 4,588,346 | 5/1986 | Smith | 414/673 |
| 5,149,029 | 9/1992 | Smith | 248/124 |
| 5,440,943 | 8/1995 | Holt et al. | 74/89.15 |
| 5,450,766 | 9/1995 | Holt | 73/866.5 |
| 5,552,701 | * 9/1996 | Veteran et al. | 324/158.1 |
| 5,608,334 | 3/1997 | Holt | 324/758 |

* cited by examiner

Primary Examiner—Vinh P. Nguyen
(74) Attorney, Agent, or Firm—George O. Saile; Stephen B. Ackerman

(57) ABSTRACT

An apparatus for quickly and reliably aligning a semiconductor handling apparatus with a semiconductor tester. Two docking plates are attached, one to the device handler and one to the device tester. On the docking plates a substructure is mounted which first allows initial alignment of the handler plate with the test head plate after which the substructure provides the means of securely positioning and interlocking the handler plate with the test head.

8 Claims, 4 Drawing Sheets

UNIVERSAL DOCKING SYSTEM

FIELD OF THE INVENTION

The invention relates to the field of semiconductor processing, and more specifically to docking and undocking of an electronic test head with a device handler.

DESCRIPTION OF THE PRIOR ART

In the automatic testing of integrated circuits (IC) and other electronic devices, special device handlers have been used which place the device to be tested in position. The electronic testing itself is provided by a large and sophisticated automatic testing system that includes a test head. The test head is required to connect to and dock with the device handler. In such testing systems, the test head is usually very heavy. The reason for this heaviness is that the test head uses high-speed electronic timing signals. The electronic test circuits must therefore be located as close as possible to the device under test. Accordingly, the test head has been densely packaged with electronic circuits in order to achieve the high speed testing of the state of the art devices.

The state of the art left much to be desired in providing a manipulator or positioner to easily move the heavy test head accurately in position with respect to the device handler mechanism. The user has had to move the heavy device handler or the heavy positioner itself in order to provide alignment. When the test head is accurately in position with respect to the device handler, the test head and the device handler are said to be aligned. When the test head and the device handler are aligned, the fragile test head and the device handler electrical connections can be brought together (that is docked) enabling the transfer of test signals between the test head and the device handler. Prior to docking, the test head and the device handler electrical connections must be precisely aligned to avoid damaging the electrical connectors.

In a typical electrical test environment, the test head is manually guided to connect delicate electrical pins to the contacting plate of the device handler without alignment guides after which the test head is locked or kept level by means of a device manipulator. This often presents problems during production testing. For instance, the test head can drop in position and loose the electrical connections with the device handler. Or the device handler vibrates causing intermittent electrical connections with the device test head or even causing damage to the electrical equipment.

U.S. Pat. No. 5,440,943 (Holt et al) shows a positioner that facilitates docking and undocking of an electronic test head with a device handler.

U.S. Pat. No. 5,149,029 (Smith) discloses a system for positioning an electronic test head with respect to an electronic device handler.

U.S. Pat. No. 5,450,766 (Holt) shows a test head manipulator for positioning a test head with respect to a device handler.

U.S. Pat. No. 5,608,334 (Holt) shows a device testing system.

U.S. Pat. No. 4,527,942 (Smith) shows an electronic test head positioner for test systems.

U.S. Pat. No. 4,588,346 (Smith) shows a method for positioning an electronic test head.

SUMMARY OF THE INVENTION

The present invention addresses the problems of quickly and reliably positioning and interlocking a device handler head with respect to a device tester head.

The primary objective of the present invention is to provide an apparatus for establishing quick and reliable connections between the semiconductor device handler and the semiconductor device tester.

Another objective of the present invention is to reduce the negative effect on device yield caused by unreliable device handler to device tester connection.

Yet another objective of the present invention is to reduce the need for device re-testing due to unreliable testing results caused by unreliable device handler to device tester connections (re-screen downtimes).

Yet another objective of the present invention is to reduce the downtime required for changing equipment set-up within the semiconductor testing and manufacturing environments.

Yet another objective of the present invention is to facilitate the required equipment conversions between different device testing set-up configurations; such that the testhead can be docked securely to the device handler on either 0-degree, 90-degree, or 180-degree positions; such that the device testhead can be docked securely to the device handler on either single-site, double-site or three-site contacts; and such that the device testhead can be docked securely to the device handler on a multiplicity of, different thicknesses of the electronic contactors.

The present invention teaches a system for positioning an electronic test head with respect to an electronic device handler. This system comprises two interface plates and an arrangement of mounting brackets to connect the interface plates to the device handler and the device tester respectively. The present invention addresses the problem of quickly and reliably positioning a device handler plate with respect to a device test head plate. The device handler plate is used in moving the semiconductor device between positions, the device test head plate is used when testing the semiconductor device. The present invention relieves problems of questionable yield fallout, excessive downtime for re-testing and equipment set-up.

DETAILED DESCRIPTION OF THE PREFERRED EMBODIMENT

Figure 1:
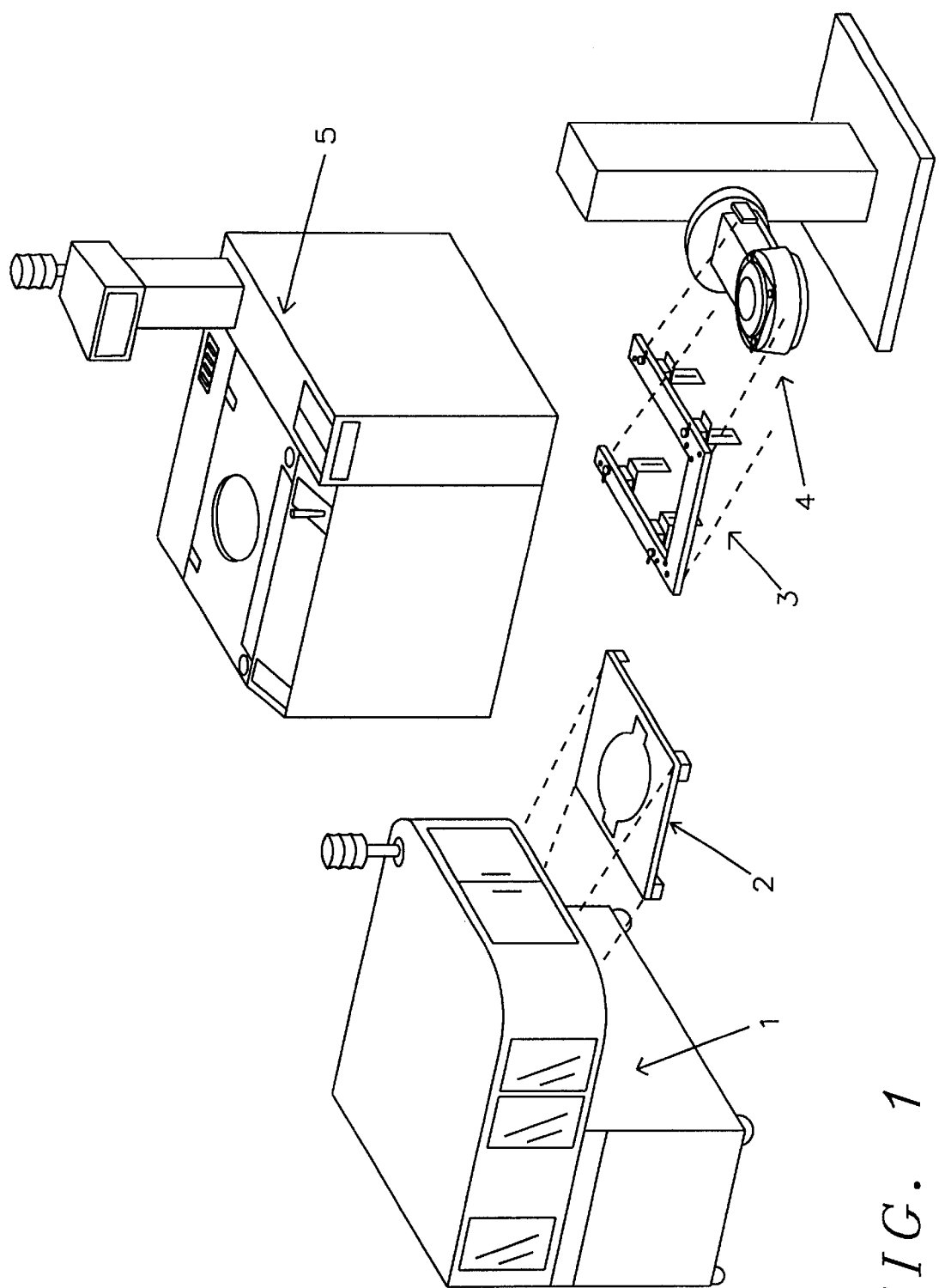
FIG. 1 shows device handler 1, the UDS handler plate 2, the Universal Docking System (UDS) test head plate 3, the device test head 4, and the device prober or tester 5.

It must be pointed out that, for clearness of overview of FIG. 1, the following two units of the tester 5 are not shown in FIG. 1: the prober plate 51 (see FIG. 3) that is attached to top of the device prober 5 and the complete head plate 61 (see FIG. 4) that interfaces (for alignment purposes) between the device prober 5 and the device prober plate 51. These two units will be highlighted in subsequent figures.

Referring now specifically to FIG.1, shown in FIG. 1 is the relative positioning of the device handler 1, the device tester 5, the device test head 4, and the two UDS device plates, that is the UDS device handler plate 2 and the UDS device test head plate 3. The UDS device handler plate 2 together with the UDS device test head plate 3 form a mechanical system which aligns, connects and disconnects with respect to each other by means of four pairs of interlocking mechanical sub-assemblies. The UDS handler plate 2 is attached to the device handler 1, the UDS test head plate 3 is attached to the device test head 4. The UDS handler plate 2 together with the UDS test head plate 3 form the Universal Docking System (UDS) of the invention. The UDS serves as the mechanism for aligning, connecting and disconnecting the two systems with which they interface. In FIG. 1 these two systems are the device handler and the device tester.

Figure 2:
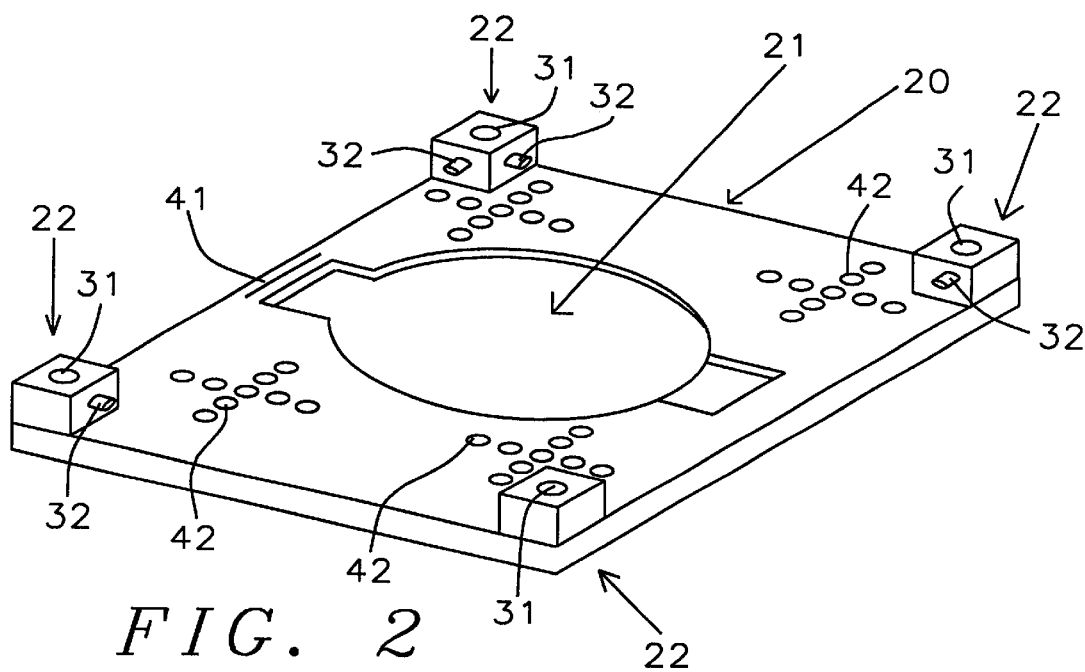
FIG. 2 shows the UDS handler plate 2.

FIG. 2 shows the UDS device handler plate 20 in more detail. In a typical application, the UDS device handler plate 20 is an 8 mm. thick aluminum plate that is 876×876 mm. in size. The dimensions for this plate are however not limited to the typical dimensions indicated, the present invention is not limited to these dimensions. The center 21 of the UDS device handler plate 20 is cut out so as not to interfere with any electrical or mechanical components of the test head. On each of the four corners 22 of the UDS device handler plate 20 are mounted an alignment socket 31 and a cam bearing 32. The UDS device handler plate 20 (FIG. 2) is mounted against the device handler 7 (FIG. 7) using extension brackets (not shown in FIG. 2) which are attached to the sides and the bottom base plate of the device handler. Threads are tapped into the handler plate 22 for screws to fasten the brackets.

The above indicated brackets provide the means for mounting the device handler plate onto the device handler. FIG. 2 also shows details of the alignment socket 31 and the cam bearing 32. The alignment socket 31 is, during the alignment of the UDS device handler plate 2 (FIG. 1) with the device test head plate 3 (FIG. 1), brought into contact with and guides an alignment pin. This action positions the UDS handler plate 2 (FIG. 1) in the correct position with respect to the UDS device test head plate 3 (FIG. 1).

FIG. 2 also shows the UDS handler plate 20 with adjustment slot guides 41 and side adjustment locations 42. For conversions of the tester where testing is required on more than a central site, such as second or third site testing, the slot guides 41 are used in conjunction with a suspend screw (not shown) attached to the device handler 1 to shift the UDS device handler plate 2 into the second or third test position. The site adjustments 42 have the same function in adjusting the UDS handler plate 2 (FIG. 1) to positions other than the central test position with respect to the test head 4 (FIG. 1).

FIG. 2 shows on the device handler plate 20 a total of four corners 22 with, on each corner 22, mounted one alignment socket 31 with, for each alignment socket 31, a set of two cam bearings 32.

Figure 3:
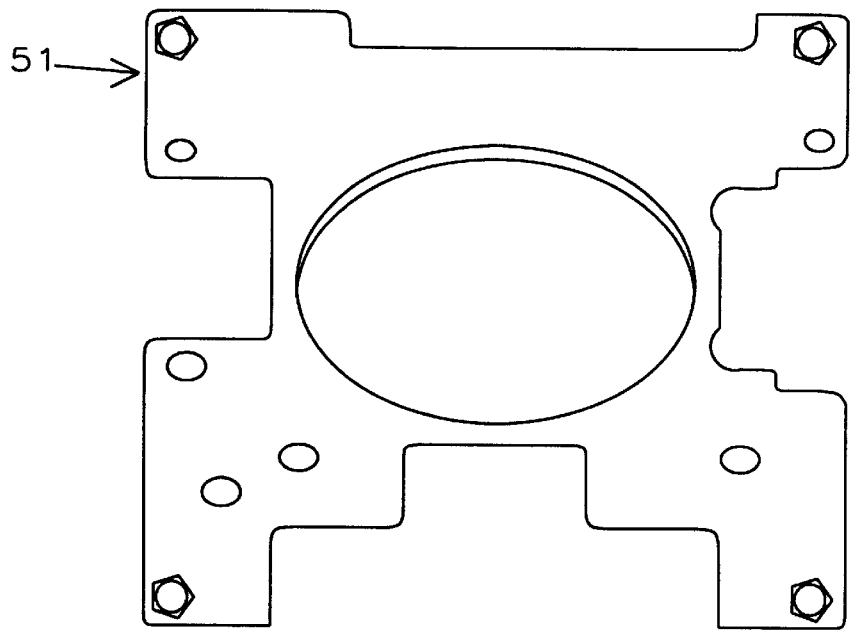
FIG. 3 shows the prober plate 51; this plate is not shown in FIG. 1.

FIG. 3 shows the prober plate 51 that has the same function as the UDS handler plate 2. However, the thickness of the prober plate 51 is typically 12 mm., this to compensate for the amount of materials which has to be removed so as not to interfere with mechanical or electrical components of the test head 4 (FIG. 1). The prober plate 51 is mounted on the head plate of the overhead device prober or tester 5.

Figure 4:
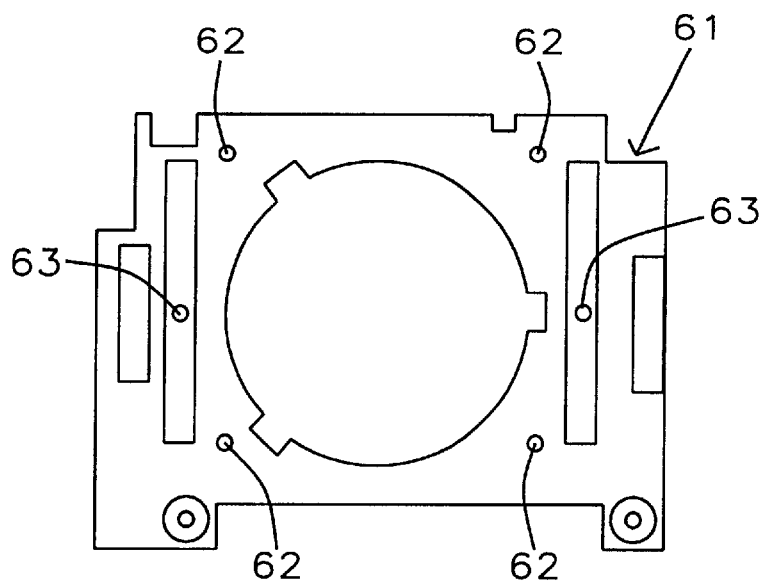
FIG. 4 shows the head plate 61 with mounting taps 62 and alignment holes 63; this plate is not shown in FIG. 1.

FIG. 4 shows the complete test head plate 61 with mounting taps 62 and alignment holes 63. These positioners are used for positioning the prober plate 61 with respect to the prober equipment 5 when attaching the prober plate 61 to this equipment.

The combination of the head plate (FIG. 4) and the prober plate (FIG. 3) provide the mechanical means for mounting the test head plate 3, FIG. 1, to the tester 5, FIG. 1, and the device handler 1, FIG. 1, that is plate 51, FIG. 3, and plate 61, FIG. 4, form the mechanical interfaces for mounting the UDS of the invention between the device handler 1, FIG. 1, and the device tester 5, FIG. 1.

Figure 5:
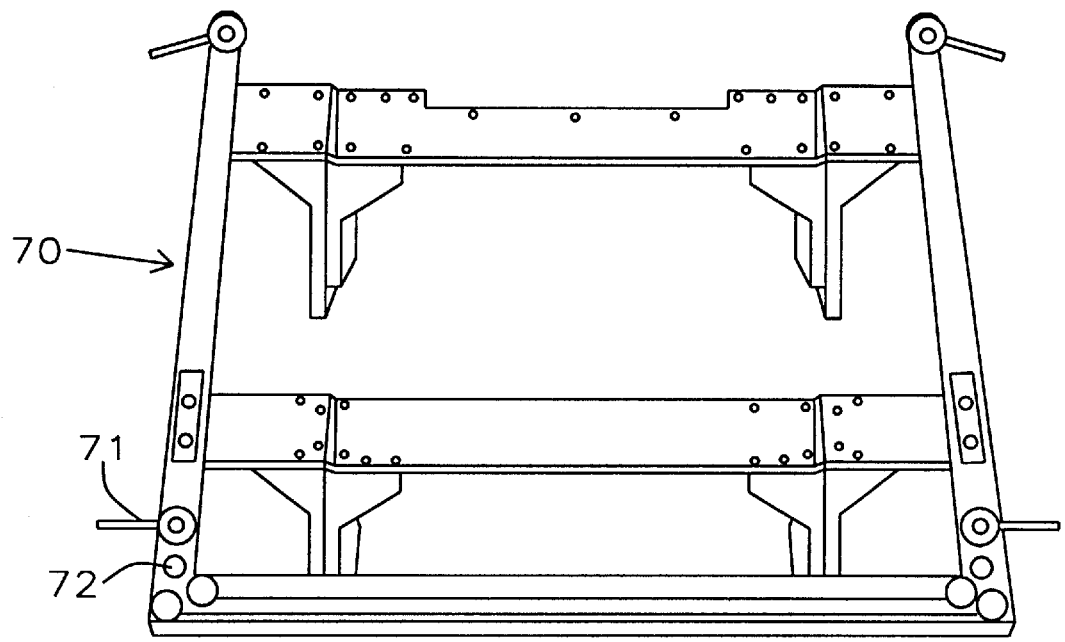
FIG. 5 shows the test device head plate 70 with UDS alignment cam 71 and UDS alignment pin 72. Four UDS alignment cams 71 and four UDS alignment pins are mounted on the test device head plate 70, only one set has been highlighted with numbers in FIG. 5.

FIG. 5 shows the test head plate 70, this assembly has three main bar members which are mounted in a U-Shape structure. The U-bar mounts around the test head using brackets.

FIG. 5 shows, on the head test plate 70, a total of four alignment cams 71 and four alignment pins 72. These four units 71/72 each align with one of the four units 31/32 on the corners of the device handler plate 20, FIG. 2, as previously highlighted under FIG. 2. The number of matching units 31/32 with 71/72 is not restricted to four but can be any number of units, such as three, that can establish stability and firm connectivity between the device handler plate 2 (FIG. 1) and the device test head plate 3 (FIG. 1).

Figure 6:
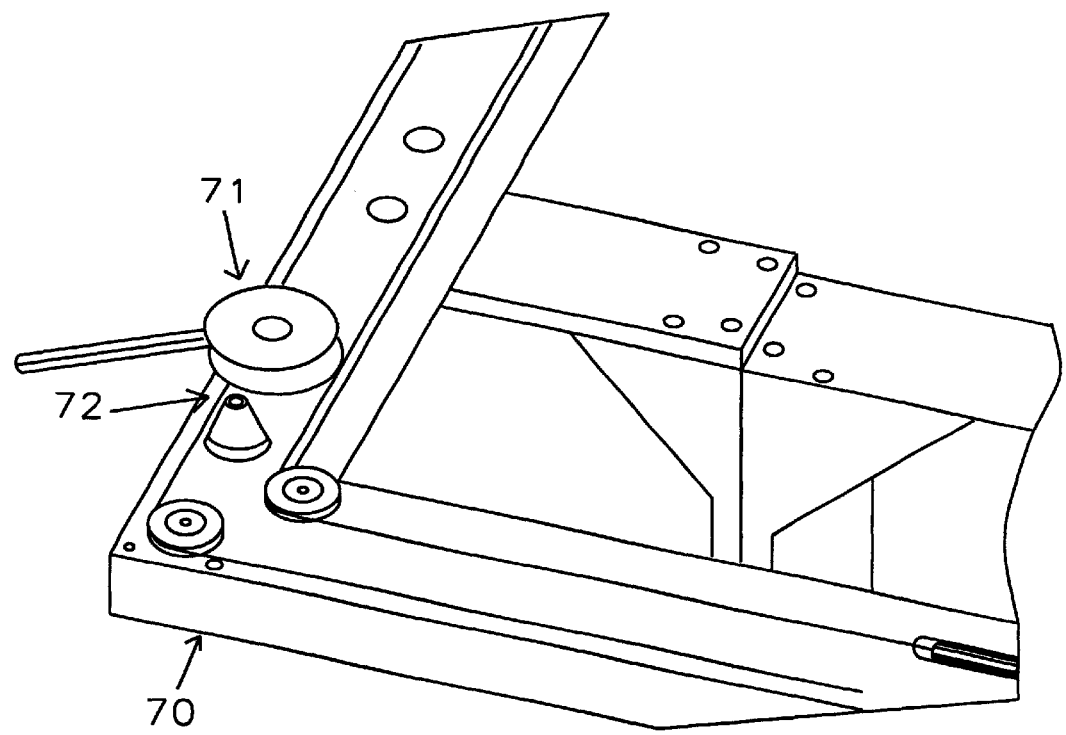
FIG. 6 shows one corner of the testhead plate with one UDS cam 71 and one alignment pin 72.

FIG. 6 shows a perspective view of one of the corners of the test plate 70. Shown in detail is the UDS alignment cam 71 with the UDS alignment pin 72.

During alignment of the device handler 1 (FIG. 1) with the test head 4 (FIG. 1), the UDS handler plate 2 (FIG. 1) is visually brought into close physical contact with the UDS test head plate 3. The alignment pin 72, FIG. 5, is positioned in line with the matching alignment socket 31, FIG. 2. The UDS device alignment cam 71, FIG. 5, is then manually rotated while final alignment of the UDS device alignment pin 72 with the alignment socket 31 is observed and assured. During the alignment of UDS alignment pin 72 with the UDS alignment socket 31, the UDS alignment cam 71 starts to touch or engage the UDS alignment cam bearing 32. Once that contact has been established and the diagonal cut of the UDS alignment cam 71 touches the UDS alignment cam bearing 32, the cam 71 can be further manually rotated. This final rotation forces the alignment pin 72 into the alignment socket 31; the rotation of the cam 71 is supported by the rotation of the cam bearings 32. After the alignment pin 72 is firmly seated in the alignment socket 31, the alignment cam 71 is locked in place.

The UDS handler plate 2 (FIG. 1) is now securely locked into place with respect to the UDS test head plate 3. The contact between the handler and the tester is furthermore assured and firm due to the firmness of the UDS constructs.

Figures 7, 8:
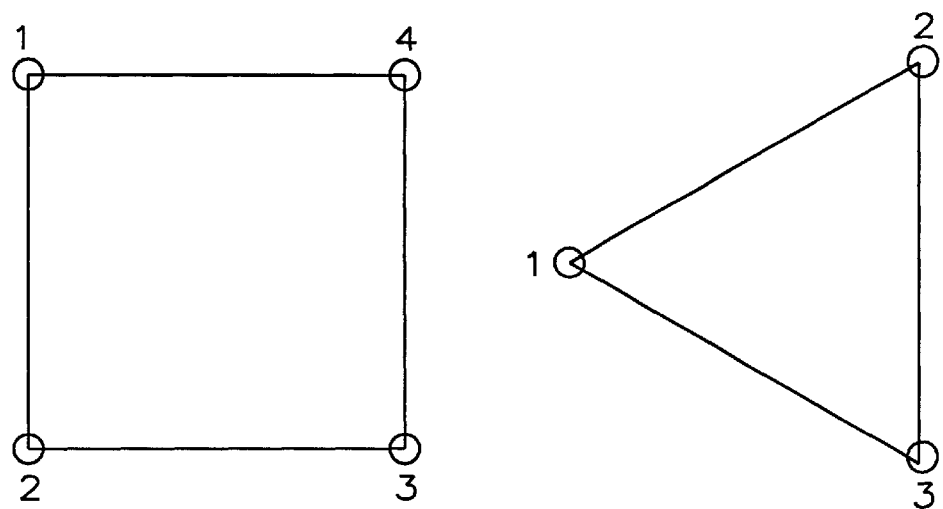
FIG. 7 shows a docking square.
FIG. 8 shows a docking triangle.

Basic geometry teaches that three points fixed in space define a plane. It is therefore apparent that, in order to accomplish the alignment of one plane with another, such as the UDS handler plate 2 with the UDS test head plate 3, three points of suspension suffice for each of these two plates. This leads to the concept of three point docking plates, this as opposed to the for point docking system as highlighted in FIGS. 2 and 5 where the UDS handler plate 20 and the UDS test head plate 70 are detailed. FIGS. 7 and 8 highlight the concept of the three point docking system.

Referring specifically to FIG. 7, the three points 2, 3, and 4 form the basic or typically used docking points. These three points provide docking possibility of 0-degrees, 90-degrees and 180-degrees docking rotation. Point 1 within FIG. 7 allows for an alternate docking point and can be used in combination with a selection or two points from the three point set 2, 3, and 4. This selection is completely equipment design and configuration dependent while it provides an additional degree of freedom in the use of the UDS docking system of the present invention.

Referring specifically to FIG. 8, the three point docking configuration shown herein by points 1, 2, and 3 provides less freedom in the possible docking configurations since this configuration limits the docking to one configuration. This limitation is however not to be considered a drawback or limitation of the present invention since there are conditions of device testing where this configuration, by means of its very simplicity, can be a configuration of choice most notably where considerations of high device throughput, speed of test set up, etc. are of importance.

Although the present invention is illustrated and described herein as embodied in a handler to tester interface which comprises two interface plates and interface positioning substructures, it is nevertheless not intended to be limited to the details as presented. Rather, various modifications may be made in the details within the scope and range of equivalents of the claims and without departing from the spirit of the invention.

What is claimed is:

1. In combination with a testing system for testing electronic devices having an electronic device handler and a substantially heavy electronic test head, a system for positioning said electronic test head for docking and undocking with said electronic device handler, in combination with mechanical interfaces for attaching said system between said device handler and said test head, in combination with mechanical interfaces for attachment of said electronic devices to said system, said system comprising:

a device handler plate;

a device tester head plate;

alignment devices for aligning said device handler plate with said device tester head plate, wherein the alignment devices for aligning said device handler plate with said device tester head plate comprises three alignment sockets mounted on said device handler plate and three alignment pins mounted on said device tester head plate where said alignment pins align with and fit into said alignment sockets, said alignment sockets are mounted in a first pattern on the surface of said device handler plate while said alignment pins are mounted on the surface of said tester head plate in a second pattern whereby said first pattern aligns with said second pattern, whereby furthermore said alignment sockets and said alignment pins are facing each other during alignment of said handler plate with said tester plate; and interlocking devices for interlocking said device handler plate with said tester head plate.

2. The test system of claim 1 wherein said device handler plate is of square or rectangular construction having a large cut-out allowing physical access to said device tester plate.

3. The test system of claim 1 wherein the device tester head plate is of square or rectangular construction of dimensions about equal to dimensions of said device handler plate to allow docking in either 0-degree, 90-degree, or 180-degree set-up orientations.

4. In combination with a testing system for testing electronic devices having an electronic device handler and a substantially heavy electronic test head, a system for positioning said electronic test head for docking and undocking with said electronic device handler, in combination with mechanical interfaces for attaching said system between said device handler and said test head, in combination with mechanical interfaces for attachment of said electronic devices to said system, said system comprising:

a device handler plate;

a device tester head plate;

alignment devices for aligning said device handler plate with said device tester head plate; and interlocking devices for interlocking said device handler plate with said tester head plate, said interlocking devices for interlocking said device handler plate with said device tester head plate comprises three cam bearings mounted on said device handler plate and three alignment cams mounted on said device tester head plate where said cam bearings align with and interact with said alignment cams, said cam bearings being mounted in a first pattern on the surface of said device handler plate while said alignment cams are mounted on the surface of said test plate in a second pattern, whereby said second pattern aligns with said first pattern, while furthermore said cam bearings and a sloping edge of said alignment cams are in contact with each other during interlocking of said handler plate with said tester plate, said alignment cams being rotated by manual force and being allowed to rotate against said cam bearings thus urging said device handler plate toward said tester head plate.

5. In combination with a testing system for testing electronic devices having an electronic device handler and a substantially heavy electronic test head, a system for positioning said electronic test head for docking and undocking with said electronic device handler, in combination with mechanical interfaces for attaching said system between said device handler and said test head, in combination with mechanical interfaces for attachment of said electronic devices to said system, said system comprising:

a device handler plate;

a device tester head plate;

alignment devices for aligning said device handler plate with said device tester head plate, said alignment devices for aligning said device handler plate with said tester head plate comprises four alignment sockets and four alignment pins where said alignment pins align with and fit into said alignment sockets, said alignment sockets being mounted in a first pattern on the surface of said handler plate while said alignment pins are arranged on said surface of said tester head plate in a second pattern whereby said first pattern aligns with said second pattern whereby furthermore said four alignment sockets and said four alignment pins are facing each other during alignment of said handler plate with said tester head plate; and interlocking devices for interlocking said device handler plate with said tester head plate.

6. In combination with a testing system for testing electronic devices having an electronic device handler and a substantially heavy electronic test head, a system for positioning said electronic test head for docking and undocking with said electronic device handler, in combination with mechanical interfaces for attaching said system between said device handler and said test head, in combination with mechanical interfaces for attachment of said electronic devices to said system, said system comprising:

a device handler plate;

a device tester head plate;

alignment devices for aligning said device handler plate with said device tester head plate; and interlocking devices for interlocking said device handler plate with said tester head plate, said interlocking devices for interlocking said device handler plate with said device tester plate comprises four cam bearings mounted on said device handler plate and four alignment cams mounted on said device tester head plate where said cam bearings align with and interact with said alignment cams, said cam bearings being arranged in a first pattern on the surface of said handler plate while said alignment cams are arranged on said surface of said tester head plate in a second pattern that aligns with said first pattern, while furthermore said cam bearings and a sloping edge of said alignment cams are in contact with each other during interlocking of said handler plate with said tester plate, said alignment cams being rotated by manual force and being allowed to rotate against said cam bearings thus urging said handler plate toward said tester plate.

7. In combination with a testing system for testing electronic devices having an electronic device handler and a substantially heavy electronic test head, a system for positioning said electronic test head for docking and undocking with said electronic device handler, in combination with mechanical interfaces for the attachment of said system to said device handler and to said test head, in combination with mechanical interfaces for attachment of said electronic devices to said system, said system comprising:

A handler plate having a large cutout allowing physical access to said tester having four corners;

four alignment sockets, one alignment socket mounted in each of said four corners of said handler plate;

four cam bearings, one cam bearing mounted in each of said four corners of said handler plate and in alignment with said alignment sockets;

a test head plate with four corners, which align with said four corners of said handler plate;

four alignment cams, one alignment cam mounted in each of the four corners of said test head plate; and four alignment pins, one alignment pin mounted in each of said four corners of said test head plate and in alignment with said alignment cams.

8. In combination with a testing system for testing electronic devices having an electronic device handler and a substantially heavy electronic test head, a system for positioning said electronic test head for docking and undocking with said electronic device handler, in combination with mechanical interfaces for the attachment of said system to said device handler and to said test head, in combination with mechanical interfaces for attachment of said electronic devices to said system, said system comprising:

a device handler plate having a large cutout allowing physical access to said tester, said device handler plate having four corners, said device handler plate comprising a first triangle on the surface thereof;

a tester head plate having four corners, said four corners of said tester head plate aligning with said four corners of said device handler plate, said tester head plate comprising a second triangle on the surface thereof, corners of said second triangle being aligned with corners of said first triangle;

three alignment cams mounted on the surface of said tester head plate, one alignment cam being mounted in each of three corners of said second triangle on the surface of said tester head plate;

three cam bearings mounted on the surface of said device handler plate, one cam bearing being mounted in each of three corners of said first triangle on the surface of said device handler plate, said three cam bearings mounted on the surface of said device handler plate being aligned with said three alignment cams mounted on the surface of said tester head plate;

three alignment sockets, one alignment socket mounted in each of three corners of said first triangle on the surface of said device handler plate; and three alignment pins, one alignment pin mounted in each of said three corners of said second triangle on the surface of said tester head plate, said three alignment pins mounted on the surface of said tester head plate being aligned with said three alignment sockets mounted on the surface of said device handler plate.

* * * * *